United States Patent [19]
Pang

[11] Patent Number: 6,002,302
[45] Date of Patent: Dec. 14, 1999

[54] FREQUENCY GENERATOR

[75] Inventor: Dai Sung Pang, Seoul, Rep. of Korea

[73] Assignee: LG Semicon Co., Ltd., Cheongju, Rep. of Korea

[21] Appl. No.: 09/060,997

[22] Filed: Apr. 16, 1998

[30] Foreign Application Priority Data

Apr. 28, 1997 [KR] Rep. of Korea ............... 15979/1997

[51] Int. Cl.$^6$ ............................................. H03L 7/085
[52] U.S. Cl. ..................... 331/1 A; 331/17; 331/18; 331/25; 327/157; 327/159
[58] Field of Search ........................ 331/1 A, 16, 17, 331/18, 25; 327/105, 156–159; 455/260

[56] References Cited

U.S. PATENT DOCUMENTS

| | | | |
|---|---|---|---|
| 3,882,412 | 5/1975 | Apple, Jr. | 331/1 A |
| 4,380,742 | 4/1983 | Hart | 331/1 A |
| 4,792,768 | 12/1988 | Fried et al. | 331/11 |
| 4,890,071 | 12/1989 | Curtis | 331/11 |
| 4,918,405 | 4/1990 | Herleikson | 331/11 |
| 4,929,918 | 5/1990 | Chung et al. | 331/10 |
| 5,170,135 | 12/1992 | Ito et al. | 331/1 A |

*Primary Examiner*—David Mis
*Attorney, Agent, or Firm*—Fleshner & Kim

[57] ABSTRACT

A high speed frequency generator is disclosed. The frequency generator includes a frequency oscillator producing an output signal of a predetermined frequency, a first frequency divider frequency-dividing the first frequency oscillator's output signal, and a second frequency divider frequency-dividing an input signal by a predetermined factor. A flip-flop receives a signal generated from the second frequency divider and produces an output signal in accordance with an input clock signal. A pulse-width detector detects a width of the output signal of the flip-flop. A comparing part compares an output signal of the pulse-width detector with a reference value to control a counter that counts to a prescribed digital value that corresponds to a desired frequency. A digital-analog converter converts an output digital value from the counter into an analog value. A voltage controlled oscillator produces a clock signal in response to an output signal of the digital-analog converter and feeds the clock signal back to the second frequency divider.

19 Claims, 4 Drawing Sheets

F I G.3
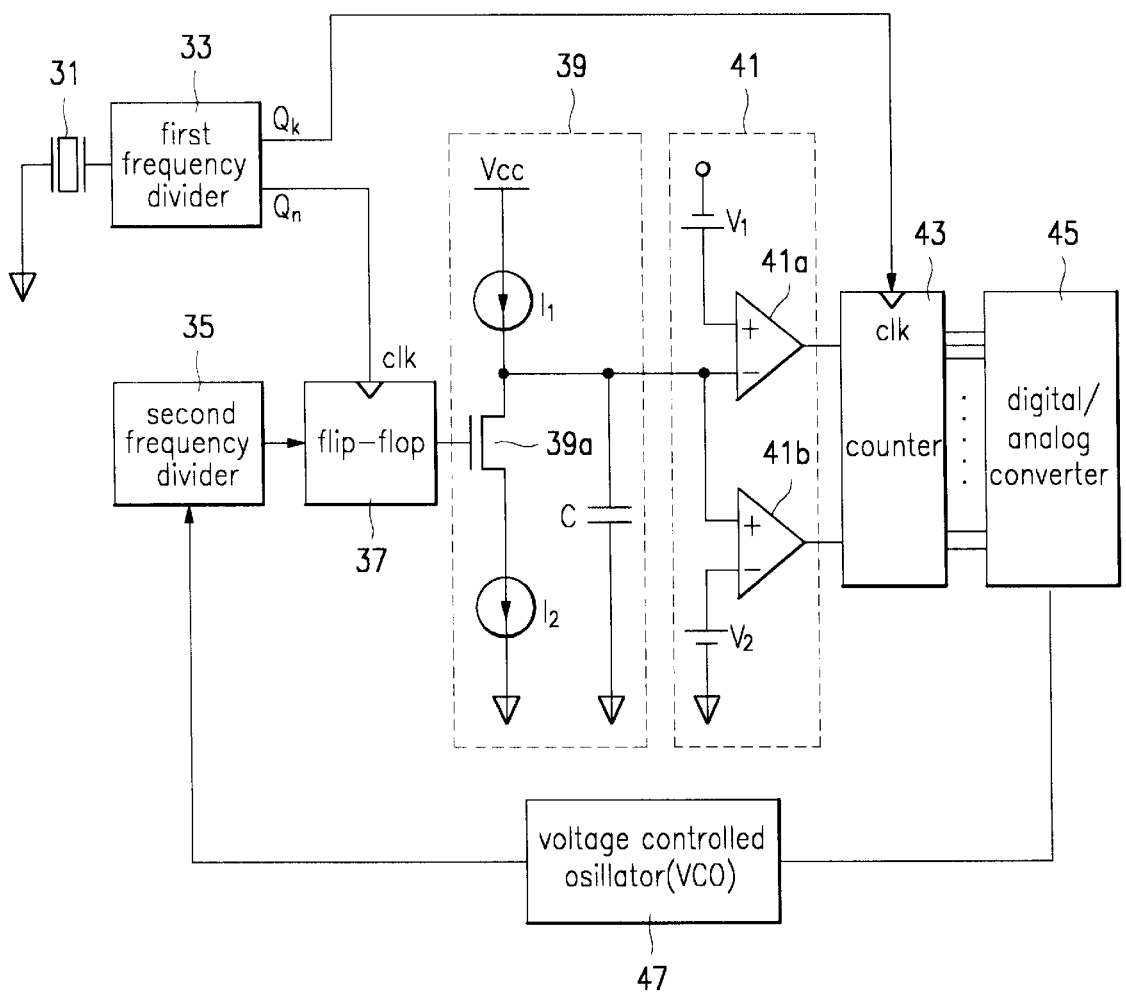

FIG.6

Table1. Counter(43)Function

| 41a Out | 41b Out | Counter(43) |
|---------|---------|-------------|
| 0 | 0 | None |
| 1 | 0 | Up Counter |
| 0 | 1 | Down Counter |
| 1 | 1 | Stop |

FREQUENCY GENERATOR

BACKGROUND OF THE INVENTION

1. Field of the Invention

The present invention relates to a semiconductor device, and in particular, the present invention relates to a frequency generator.

2. Background of the Related Art

FIG. 1 is a block diagram showing a related art clock synthesizer. The related art clock synthesizer includes a quartz crystal oscillator 11, a first frequency divider 13, a phase and frequency detector 15, a low-pass filter 17, a voltage controlled oscillator (VCO) 19 and a second frequency divider 21. The quartz crystal oscillator 11 is connected to the first frequency divider 13. The first frequency divider 13 divides an output frequency of quartz crystal oscillator 11 by a predetermined factor. The second frequency divider 21 divides an output frequency of the VCO 19 by a predetermined factor. The phase and frequency detector 15 receives output signals from each of the first and second frequency dividers 13 and 21 and detects its phase and frequency. The low-pass filter 17 produces an output signal of the phase and frequency detector 15 as a direct current (DC) component signal. The VCO 19 produces a frequency of the output signal of the low-pass filter 17.

In the related art clock synthesizer, a final output value is determined by the output frequency of the first frequency divider 13 and the output frequency of the second frequency divider 21. If the first frequency divider 13 output frequency is faster than the second frequency divider 21 output frequency, the output signal of the phase and frequency detector 15 attains a high level. On the contrary, if the first frequency divider 13 output frequency is slower than the second frequency divider 21 output frequency, the phase and frequency detector 15 output signal attains a low level. If the first frequency divider 13 output frequency is the same as the second frequency divider 21 output frequency, the phase and frequency detector 15 output attains a tri-state.

The output signal of the phase and frequency detector 15 in each of the above cases is input to the low-pass filter 17. The low-pass filter 17 then produces the DC component signal. The DC component signal is input to the VCO 19, and the VCO 19 produces the frequency corresponding to its input signal.

The output frequency of the VCO 19 is again input to the second frequency divider 21. The operation is repeated until the first frequency divider 13 output frequency is the same as the second frequency divider 21 output signal, which is depicted in FIG. 2. If the first frequency oscillator 13 output frequency F1 and the second frequency divider 21 output frequency F2 are initially not the same, the sequence of the above operations is repeatedly executed to obtain the same output frequencies.

However, the related art clock synthesizer has various disadvantages. The sequence of the above operation is executed repeatedly until the frequency lock is realized (i.e., the first frequency divider 13 output frequency is the same as the second frequency divider 19), which is time consuming. Further, in the low-pass filter that is formed by a resistor and a capacitor, the space that the capacitor occupies is too large, and the device size is increased. Thus, the related art clock synthesizer has a disadvantageous layout aspect.

SUMMARY OF THE INVENTION

An object of the present invention is to provide a frequency generator that substantially obviates one or more of the problems caused by limitations and disadvantages of the related art.

Another object of the present invention to provide a reduced size frequency generator.

A further object of the present invention is to provide a high speed frequency generator.

A still further object of the present invention is to provide a frequency generator that reduces the time required to produce a desired clock signal.

To achieve these and other advantages in a whole or in parts and in accordance with the purpose of the present invention, as embodied and broadly described, the present invention discloses a frequency generator including a first frequency oscillator producing an output signal of a predetermined frequency, a first frequency divider frequency-dividing an output signal of the first frequency oscillator, a second frequency divider frequency-dividing an input signal by a predetermined factor, and a flip-flop receiving a signal generated from the second frequency divider and producing a signal in accordance with an input clock signal. The frequency generator can also includes a pulse-width detector detecting a width of an output signal of the flip-flop, a comparing part comparing an output signal of the pulse-width detector with a reference value, a counter counting a digital value that corresponds to a desired frequency in response to an output signal of the comparing part, a digital-analog converter converting a digital value from the counter into an analog value, and a voltage controlled oscillator producing a clock signal that feeds back to the second frequency divider in response to an output signal of the digital-analog converter.

To further achieve these and other advantages in a whole or in parts and in accordance with the purpose of the present invention, as embodied and broadly described, the present invention discloses a frequency generator including a second frequency dividing circuit that frequency-divides an input signal, a latch circuit that receives an output signal from the second frequency dividing circuit and transmits an output signal based on a clock signal, a pulse-width detecting circuit that detects a width of the output signal of the latch circuit, a comparing device that compares an output signal of the pulse-width detecting circuit with a reference value, a counting circuit that counts to a prescribed digital value based on an output signal of the comparison circuit and an oscillator circuit that generates the input signal that corresponds to an output signal of the counting circuit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein:

FIG. 3 is a block diagram showing a preferred embodiment of a frequency generator in accordance with the present invention;

FIG. 6 is a diagram showing counter functions.

DETAILED DESCRIPTION OF PREFERRED EMBODIMENTS

Figure 1:
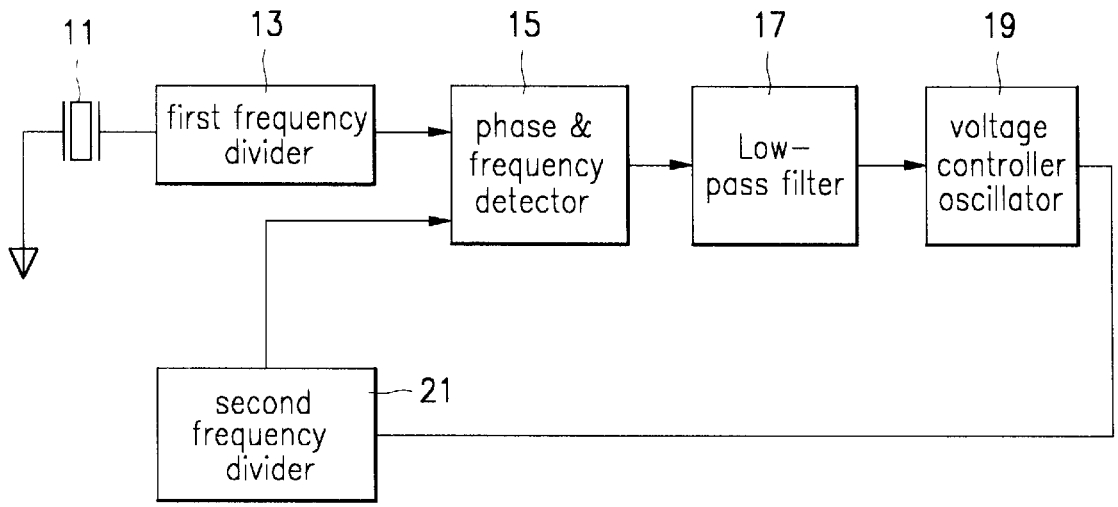
FIG. 1 is a block diagram showing a related art clock synthesizer.
Figure 2:
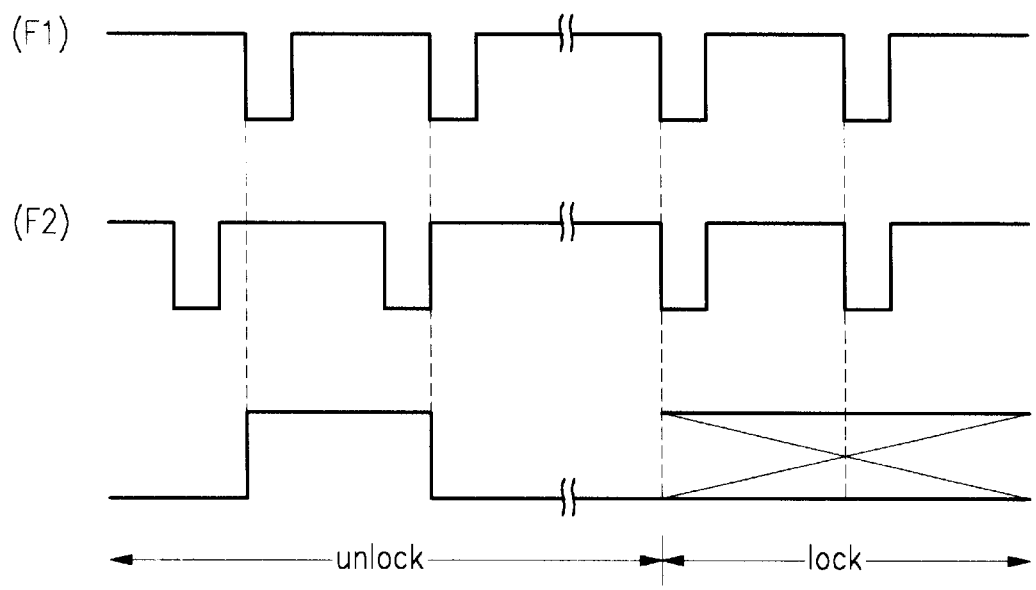
FIG. 2 is a diagram showing timing waveforms of the clock synthesizer of FIG. 1.

As shown in FIG. 3, a preferred embodiment of a frequency generator according to the present invention includes a first oscillator 31, a first frequency divider 33, a second frequency divider 35, a flip-flop 37, a pulse width detector 39, a comparing circuit 41, a counter 43, a digital/analog converter 45 and a voltage controlled oscillator (VCO) 47. The first oscillator 31 is a quartz crystal oscillator and is coupled to the first frequency divider 33. The first frequency divider 33 is also coupled to the flip-flop 37 and the counter 43. The flip-flop 37 is preferably a D flip-flop. The second frequency divider 35 is between the VCO 47 and the flip-flop 37. The pulse width detector 39 is coupled between the flip-flop 37 and the comparing circuit 41. A clock signal Qk output from the first frequency divider 33 is input to the counter 43 that is coupled to the comparing circuit 41. The digital/analog converter 45 is coupled between the comparing circuit 41 and the VCO 47.

The pulse width detector 39 includes first and second current sources $I_1$ and $I_2$, a switching transistor 39a, and a capacitor C. The comparing circuit 41 includes first and second comparators 41a and 41b and first and second voltage sources $V_1$ and $V_2$ that respectively store reference values for the first and second comparators 41a and 41b.

The first frequency divider 33 divides a frequency produced from the first oscillator 31. Each of the flip-flop 37 and the counter 43 receive an output signal from the first frequency divider 33 as a clock signal. The second frequency divider 35 divides a frequency received from the VCO 47, and applies its output signal to the flip-flop 37. An output signal from the flip flop 37 is applied to a gate terminal of the switching transistor 39a of the pulse-width detector 39. An output signal of the pulse-width detector 39 is based on the output signal of the flip-flop 37. The pulse width detector 39 output signal can be determined using the following equation in a period where the output signal of flip-flop 37 attains a high level:

$$V = \frac{i}{C}t \quad (1)$$

where t denotes a half cycle of the output of the flip-flop 37.

The relationship of first and second current sources $I_1$ and $I_2$ of the pulse width detector 39 preferably is determined by the following equation:

$$I_2 = 2I_1 \quad (2)$$

Accordingly, an output waveform of the pulse width detector 39 is determined by equations 1 and 2. The pulse width detector 39 output signal is repeatedly input to the comparing circuit 41. The comparing circuit 41 starts a comparison according to a signal (e.g., a clock signal) received from the pulse width detector 39 via the first frequency divider 33. As described above, the first and second voltage sources $V_1$ and $V_2$ store reference values of the first and second comparators 41a and 41b, respectively.

An output voltage signal of the first voltage source $V_1$ is preferably high level while an output voltage signal of the second voltage source $V_2$ is preferably low level. In the comparing circuit 41, an input signal input to a negative terminal of the first comparator 41 and a positive terminal of the second comparator 41 is compared with the reference values stored in the first and second voltage sources $V_1$ and $V_2$. If the level of the input signal received at the comparators 41a and 41b is higher than a high-level reference value, the first comparator 41a produces a low-level signal and the second comparator 41b generates a high-level signal. When the input signal is lower than a low-level reference value, the first comparator 41a produces a high-level signal, and second comparator 41b generates a low-level signal. If the level of the input signal is lower than the high-level reference value and higher than the low-level reference value (i.e., between the reference values), both the first comparator 41a and the second comparator 41b produce high-level signals.

The output signal of the comparing circuit 41 is input to the counter 43. If the level of the input signal is higher than the high-level reference value, the counter 43 performs counting-down. When the input signal level is lower than the low-level reference value, the counter 43 performs counting-up. In addition, if the input signal level is lower than the high-level reference value and higher than the low-level reference value, the counter 43 stops counting operations.

Operation of the counter 43 will now be described. If output signals of the first comparator 41a and the second comparator 41b are respectively high and low level, the counter 43 acts as an up-counter. Thus, the counter 43 operates as an up-counter when the input signal is lower than a desired signal in level. If, for example, a desired digital value equals 1000, the counter 43 counts up from 0000 and continues counting up to 1000. Once the counter 43 reaches the desired digital value 1000, the counter 43 stops counting and its output is applied to the digital/analog converter 45 and is converted into an analog signal.

If output signals of the first comparator 41a and the second comparator 41b are respectively low and high level the counter 43 acts as a down-counter because the input signal is lower than the desired or required signal. If, for example, the desired digital value is again 1000 and the input signal corresponds to a digital value of 1101, the counter 43 counts down to 1000. Once the counter 43 reaches 1000, the counter 43 stops counting and its output is applied to digital/analog converter 45 and converted into an analog signal. In this case, because the input signal is higher than the desired one, the counter 43 counts down to make the current signal's level lower. The above mentioned functions of the counter 43 are disclosed in FIG. 6.

The digital/analog converter 45 output signal is applied to the VCO 47 again. The VCO 47 produces a clock signal to the second frequency divider 35 in response to the output signal of digital/analog converter 45.

As the VCO 47's output signal is input to the pulse width detector 39 via the flip-flop and subsequently applied to the comparing circuit 41 again, each of the output signals of the first comparator 41a and the second comparator 41b attains a high level. When the output signals of the first and second comparator 41a and 41b are high level, the desired clock signal (e.g., that corresponds to 1000) is generated from the VCO 47. Accordingly, further clock control is not required.

Figure 4:
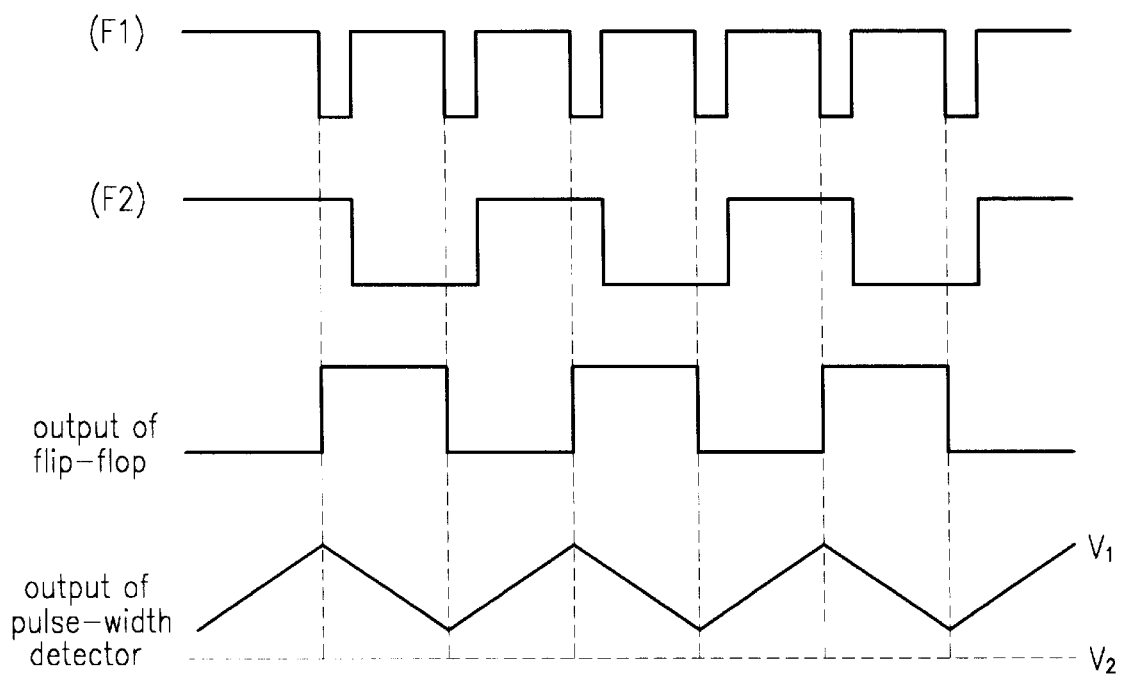
FIG. 4 is a diagram showing timing waveforms of the frequency generator of FIG. 3.

In the preferred embodiment of the frequency generator, the lock-in time of desired frequencies is determined by the clock speed of the counter 43. FIG. 4 is a diagram showing timing of the preferred embodiment of the frequency generator.

As shown in FIG. 4, an output waveform F1 of the first frequency divider 33 and an output waveform F2 of the second frequency divider 35 do not correspond. The flip-flop 37 uses the first frequency divider 33 output signal as a clock signal, and transmits the second frequency divider 35 output signal to the pulse-width detector 39, whenever the clock signal is applied to the first frequency divider 33. The pulse-width detector 39 output waveform is determined according to the above described equations 1 and 2. Thus, when the flip-flop 37 output signal attains a high level, the switching transistor 39*a* is turned on.

Therefore, the capacitor C discharges to gradually decrease voltages applied to the comparing circuit 41. When the level of the flip-flop 37 output signal transitions low, switching transistor 39*a* is turned off, which charges the capacitor C. Thus, voltages applied to the comparing circuit 41 are gradually increased. The pulse-width detector 39 output waveform becomes triangle-shaped by the voltage swing during one cycle of the flip-flop 37 output signal.

Figure 5:
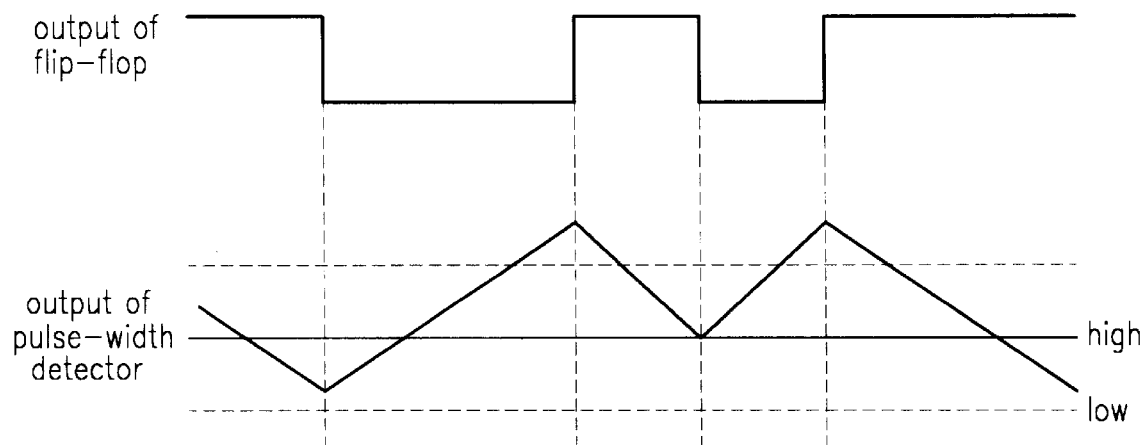
FIG. 5 is a diagram showing timing waveforms for error detection in the frequency generator of FIG. 3.

FIG. 5 is a diagram showing timing of error detection of the preferred embodiment of the frequency generator. If the flip-flop 37 output waveform is consecutively kept low or high level, the pulse-width detector 39 output waveform is not constant. At this point, the flip-flop 37 output waveform does not become constant because there is a change in a frequency-division factor of the second frequency divider 35. Division of a period of the frequency provided from the VCO 47 is preferably externally determined at the second frequency divider 35. If an initially-set period of the frequency is changed to a new period of frequency, the flip-flop 37 output waveform is not constant, as shown in FIG. 5. Whenever the period of frequencies is changed, a desired frequency is obtained by using the pulse-width detector 39 to control the pulse width.

As described above, the preferred embodiment of the frequency generator has various advantages. The preferred embodiment of the present invention reduces the time to realize frequency lock. Accordingly, the present invention is applicable to devices that require rapid switching such as mobile communication devices. Further, the preferred embodiment does not use a low-pass filter, which allows a beneficial reduction in the device size. Thus, the preferred embodiment has advantageous layout aspects and reductions in power requirements.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A frequency generator, comprising:
 a frequency oscillator that transmits an output signal of a first predetermined frequency;
 a first frequency dividing circuit that frequency-divides the first predetermined frequency signal;
 a second frequency dividing circuit that frequency-divides an input signal;
 a flip-flop that receives an output signal from the second frequency dividing circuit and transmits an output signal based on a clock signal;
 a pulse-width detecting circuit that detects a width of the output signal of the flip-flop;
 a comparison circuit that compares an output signal of the pulse-width detecting circuit with a reference value;
 a counting circuit that counts to a prescribed digital value based on an output signal of the comparison circuit;
 a digital-analog convertor that converts a digital value, received from the counting circuit into an analog value; and
 a voltage controlled oscillator that receives an output signal from the digital-analog convertor and transmits the input signal.

2. The frequency generator of claim 1, wherein the first frequency oscillator includes a quartz-crystal oscillator.

3. The frequency generator of claim 1, wherein the flip-flop includes a D flip-flop.

4. The frequency generator of claim 1, wherein the first frequency dividing circuit outputs the clock signal to the flip-flop.

5. The frequency generator of claim 1, wherein the counting circuit operates based on a second clock signal received from the first frequency dividing circuit.

6. The frequency generator of claim 1, wherein the pulse-width detecting circuit comprises:
 a transistor that receives the output signal of the flip-flop at a control electrode;
 a first current source coupled to a second electrode of the transistor;
 a second current source coupled to a first electrode of the transistor; and
 a capacitor coupled in parallel between the second electrode of the transistor and the first current source.

7. The frequency generator of claim 6, wherein upon receiving a high level output signal from the flip-flop an output waveform of the pulse-width detecting circuit output signal becomes a low level, and wherein upon receiving a low level output signal from the flip-flop the pulse-width detecting circuit output signal becomes high level.

8. The frequency generator of claim 1, wherein the counting circuit operates as at least one of an up-counter and a down-counter based on the output signal of the comparison device.

9. The frequency generator of claim 1, wherein the comparison device comprises:
 a first comparator that compares the pulse-width detecting circuit output signal with a first reference value; and
 a second comparator that compares the pulse-width detecting circuit output signal with a second reference value.

10. The frequency generator of claim 9, wherein the first reference value is higher than the second reference value, wherein the counting circuit serves as a down counter upon receiving a low level output signal of the first comparator and a high level output signal of the second comparator, and wherein the counting circuit serves as an up counter upon receiving a high level output signal of the first comparator and a low level output signal of the second comparator.

11. The frequency generator of claim 1, wherein the first frequency divider frequency-divides using a first predetermined factor and the second frequency divider frequency-divides using a second predetermined factor.

12. The frequency generator of claim 1, wherein the prescribed digital value is variable.

13. A frequency generator, comprising:
 a frequency dividing circuit that frequency-divides an input signal;
 a latch circuit that receives an output signal from the frequency dividing circuit and transmits an output signal based on a clock signal;
 a pulse-width detecting circuit that detects a width of the output signal of the latch circuit;
 a comparing device that compares an output signal of the pulse-width detecting circuit with a reference value;
 a counting circuit that counts to a prescribed digital value based on an output signal of the comparison circuit; and an oscillator circuit that generates the input signal that corresponds to an output signal of the counting circuit.

14. The frequency generator of claim 13, further comprising:
- a frequency oscillator that transmits an output signal of a first predetermined frequency; and
- a first frequency dividing circuit that frequency-divides the first predetermined frequency signal to output the clock signal and a second clock signal to the counting circuit.

15. The frequency generator of claim 13, wherein the oscillator circuit comprises:
- a digital-analog convertor that converts a digital value received from the counting circuit into an analog value; and
- a voltage controlled oscillator that receives an output signal of the digital-analog convertor, and transmits the input signal.

16. The frequency generator of claim 13, wherein the latch circuit includes a flip-flop.

17. The frequency generator of claim 13, wherein the pulse-width detecting circuit comprises:
- a transistor that receives the output signal of the latch circuit at a control electrode;
- a first current source coupled to a second electrode of the transistor;
- a second current source coupled to a first electrode of the transistor; and
- a capacitor coupled in parallel between the second electrode of the transistor and the first current source.

18. The frequency generator of claim 13, wherein the counting circuit operates as one of an up-counter and a down-counter based on the output signal of the comparing device.

19. The frequency generator of claim 13, wherein the comparing device comprises:
- a first comparator that compares the pulse-width detecting circuit output signal with a first reference value; and
- a second comparator that compares the pulse-width detecting circuit output signal with a second reference value.

* * * * *